United States Patent [19]

Olbrich et al.

[11] Patent Number: 5,083,364
[45] Date of Patent: Jan. 28, 1992

[54] SYSTEM FOR MANUFACTURING SEMICONDUCTOR SUBSTRATES

[75] Inventors: Herbert Olbrich, Rutesheim; Joseph Gentischer, Remshalden; Wolfgang Fruhauf, Gerlingen; Johann Dorner, Deizizau; Günther Breitschwerdt, Stuttgart; Horst Kunze-Concewitz, Wiernsheim-Serres; Wolfgang Schmutz, Zimmern; Roland Mann, Stuttgart, all of Fed. Rep. of Germany

[73] Assignee: Convac GmbH, Wiernsheim, Fed. Rep. of Germany

[21] Appl. No.: 466,374

[22] PCT Filed: Oct. 19, 1988

[86] PCT No.: PCT/EP88/00936
§ 371 Date: Mar. 20, 1990
§ 102(e) Date: Mar. 20, 1990

[87] PCT Pub. No.: WO89/04053
PCT Pub. Date: May 5, 1989

[30] Foreign Application Priority Data

Oct. 20, 1987 [DE] Fed. Rep. of Germany ....... 3735449

[51] Int. Cl.$^5$ .................... B23Q 7/14; B65G 65/00
[52] U.S. Cl. ..................................... 29/564; 118/719; 414/217

[58] Field of Search ............... 29/564, 563, 650, 740, 29/759, 885, 33 P; 414/217; 118/719, 729; 156/345, 643, 664; 406/72, 74

[56] References Cited

U.S. PATENT DOCUMENTS

| | | | |
|---|---|---|---|
| 4,293,249 | 10/1981 | Whelan | 406/72 |
| 4,483,651 | 11/1984 | Nakane et al. | 414/217 |
| 4,671,707 | 6/1987 | Vancelette et al. | 25/759 |
| 4,687,542 | 8/1987 | Davis et al. | 118/729 X |
| 4,722,298 | 2/1988 | Rubin et al. | 414/217 X |
| 4,801,241 | 1/1989 | Zajac et al. | 414/217 X |
| 4,842,686 | 6/1989 | Davis et al. | 156/345 X |
| 4,911,597 | 3/1990 | Maydan | 414/217 |

FOREIGN PATENT DOCUMENTS

| | | | |
|---|---|---|---|
| 61-310 | 5/1986 | Japan | 414/217 |
| 12914 | 1/1990 | Japan | 156/345 |

Primary Examiner—William Briggs
Attorney, Agent, or Firm—Jones, Tullar & Cooper

[57] ABSTRACT

A system for manufacturing substrates, in particular wafers, glass masks, and channels, having individual process stations for treating and/or processing the various substrates in a clean environment. A plurality of interchangeable and aligned process modules are provided which are connected and disconnected from a media bus in which inflow and outflow lines are situated. These lines serve to supply the process modules through the noted connection with chemicals, gases, liquids, data and energy as needed.

28 Claims, 4 Drawing Sheets

SYSTEM FOR MANUFACTURING SEMICONDUCTOR SUBSTRATES

BACKGROUND OF THE INVENTION

Description

The invention relates to a system for manufacturing substrates, in particular wafers, glass masks, and channels, having individual process stations for treating and/or processing the various substrates in a clean environment and having transport apparatus for transporting the substrates among the various process stations; the required chemicals, gases, liquids, data, and energy are supplied to and removed from the individual process stations via inflow and outflow lines.

From European Published Patent Document 35 844 A2, a manufacturing system is know in which a plurality of process stations are accommodated in a relatively large process space. These individual process stations are each in communication with the required inflow and outflow lines. Rearrangement of the process stations is practically impossible and requires expensive conversion, which necessitates stopping the manufacturing process for a long time.

SUMMARY OF THE INVENTION

It is an object of the present invention to avoid these disadvantages by improving a manufacturing system of the type referred to above in such a way that changing the process sequence, and in particular exchanging various process stations for one another, can be done simply, in a time-saving manner, without any substantial interruption in the course of manufacture.

To attain this object, the invention provides that all the inflow and outflow lines are carried in parallel in a media bus to process modules disposed in interchangeable process stations; that coupling boxes are disposed on the media bus at the grid spacing of the process modules; and that one countercoupling is provided at each of the readily interchangeable process modules, in accordance with the coupling boxes, and that by joining the coupling box and the countercoupling, the connections of the inflow and outflow lines are made and by separating the coupling box and the countercoupling these connections are broken.

By arrangement connection points of all the inflow and outflow lines in an "interface" in this way, a very fast, time-saving exchange of the various process modules is possible. The various process modules can be connected to the media bus in a practically arbitrary sequence depending on the purpose, so that process systems can be assembled or modified to meet the various needs, or for maintenance or repair, individual process modules can simply be replaced.

This makes a substantial increase in productivity possible while at the same time reducing the proportionate expense.

In a structurally particularly simple manner, couplings and/or plugs can be disposed in the coupling box and plugs and/or couplings associated with them may be provided complementarily in the countercoupling, each of these being connected to the corresponding associated inflow or outflow lines of the media bus or process module.

For secure simultaneous coupling or uncoupling of the couplings and plugs, the coupling boxes and countercouplings may be mutually guided, assuring simultaneous aligned joining of the individual plugs and couplings, with all the plugs and couplings joinable or disconnectable parallel to the mutual guides.

Fast, simple replacement of the process stations is made possible in that the plugs and/or couplings have self-closing valves for liquid or gaseous media, so that when the coupling box and countercoupling are disconnected, at least the inflow and outflow lines carrying pressure are closed, and when the coupling box and countercoupling are joined, the inflow and outflow lines of the media bus communicate throughout with the associated inflow and outflow lines of the process module. This makes special magnetic valve controls unnecessary.

In a structurally particularly simple feature, both the coupling box and the countercoupling may each have a coupling plate, in which case the plugs and couplings associated with one another may be provided on or in these coupling plates.

Depending on the intended use, not all the couplings or plugs need to be provided at the individual process stations, but rather only those necessary for the existing inflow and outflow lines. Correspondingly, the various coupling boxes may be variously equipped in the media bus, but in that case the specialized disposition of the process modules is limited by the existing connections.

The mutual guidance of the coupling box and countercoupling or coupling plates can be effected particularly simply by means of associated guide bolts and guide bushings, at least two of which and preferably three may be provided, distributed in a spaced-apart manner.

The interchange of process stations with simultaneous secure coupling of the inflow and outflow lines can be facilitated by providing that the coupling box and the respective associated countercoupling can be joined together by means of at least one coupling device, so that the required exertion of force for connection and disconnection need not be brought to bear manually. To this end, the coupling box and/or the countercoupling or components thereof may be provided so as to be displaceable in the coupling direction on the media bus and/or on the process module. The coupling of the coupling box and countercoupling can advantageously be tripped automatically, preferably via a contact control (switch, sensors). To this end, the process module may be vertically displaceable toward the media bus, and the contact control may be tripped either when the terminal position is reached or just before the terminal position is reached.

Secure coupling of the inflow and outflow lines can be attained by providing that without mutual displacement of the process module and media bus, the connection and release of the coupling box and countercoupling or their component units are effected only by means of the mutual, preferably automatic, sensor-controlled displacment of the coupling box and/or countercoupling or component units thereof.

For automatic coupling, the coupling device may have a power cylinder, by means of the piston rod of which the coupling box and countercoupling, or component units such as their coupling plates, can be pulled together and optionally controllably disconnected. Particularly advantageously, the coupling device may have at least one motor-driven threaded rod, by means of which and at least one threaded bore the coupling box and the counter coupling or component units thereof can then be pulled together and controllably disconnected. To avoid tilting, the coupling device may be disposed in the center of force of the forces brought to bear in the coupling process in the coupling box and countercoupling.

To avoid having to dispose special switches, the current-carrying couplings and plugs may be explosion-proof, and to this end the current-carrying parts may be surrounded by a shielding jacket, with the shielding being maintained even during axial connection and release of the current-carrying lines. For shielding, an outer jacket can suitably be provided on the plug and an inner jacket on the coupling, or vice versa, which form a closed space during the coupling process and during operation; the overlap length of the outer jacket and inner jacket is greater than the contact length of the plug and coupling.

To further reduce the danger of explosion, the interior space between the outer jacket and inner jacket may be floodable with a protective gas, such as nitrogen.

To compensate for tolerances in the disposition of the plugs and couplings, these elements may be disposed resiliently yieldingly in the coupling box or countercoupling.

The various plugs and couplings are suitably placed in the coupling box or countercoupling in an easily interchangeable manner, so that the media can be carried in highly variable ways. For later replacement of individual couplings and plugs, only a slight modification of the retaining bushings is needed, so that the standardized disposition and distribution are unchanged.

To avoid contamination of the media entirely, as much as possible, at least the couplings and the plugs are made of low-contamination material. Any abrasion of material in the coupling and uncoupling processes should if at all possible be avoided entirely. The surfaces, at least, must therefore be embodied appropriately for this purpose.

To further reduce the danger of undesirable contamination, the couplings and plugs for the cleanest media may be provided at the top in the coupling boxes and countercouplings, and the couplings and plugs for the media which present a greater danger of contamination may be provided in the lower region of the coupling boxes and countercouplings.

In particular, the electrical supply lines, which of course are not vulnerable to contamination and in which there is no danger of carrying contamination into the process modules, are thus disposed in the lower region of the coupling boxes and countercouplings. Nor is there any danger of contamination here if liquid or the like should drip down from an overhead line when the lines are disconnected or coupled.

Further features according to the invention are defined in detail below along with their advantages, referring to the accompanying drawings.

DESCRIPTION OF THE PREFERRED EMBODIMENT

Figure 1:
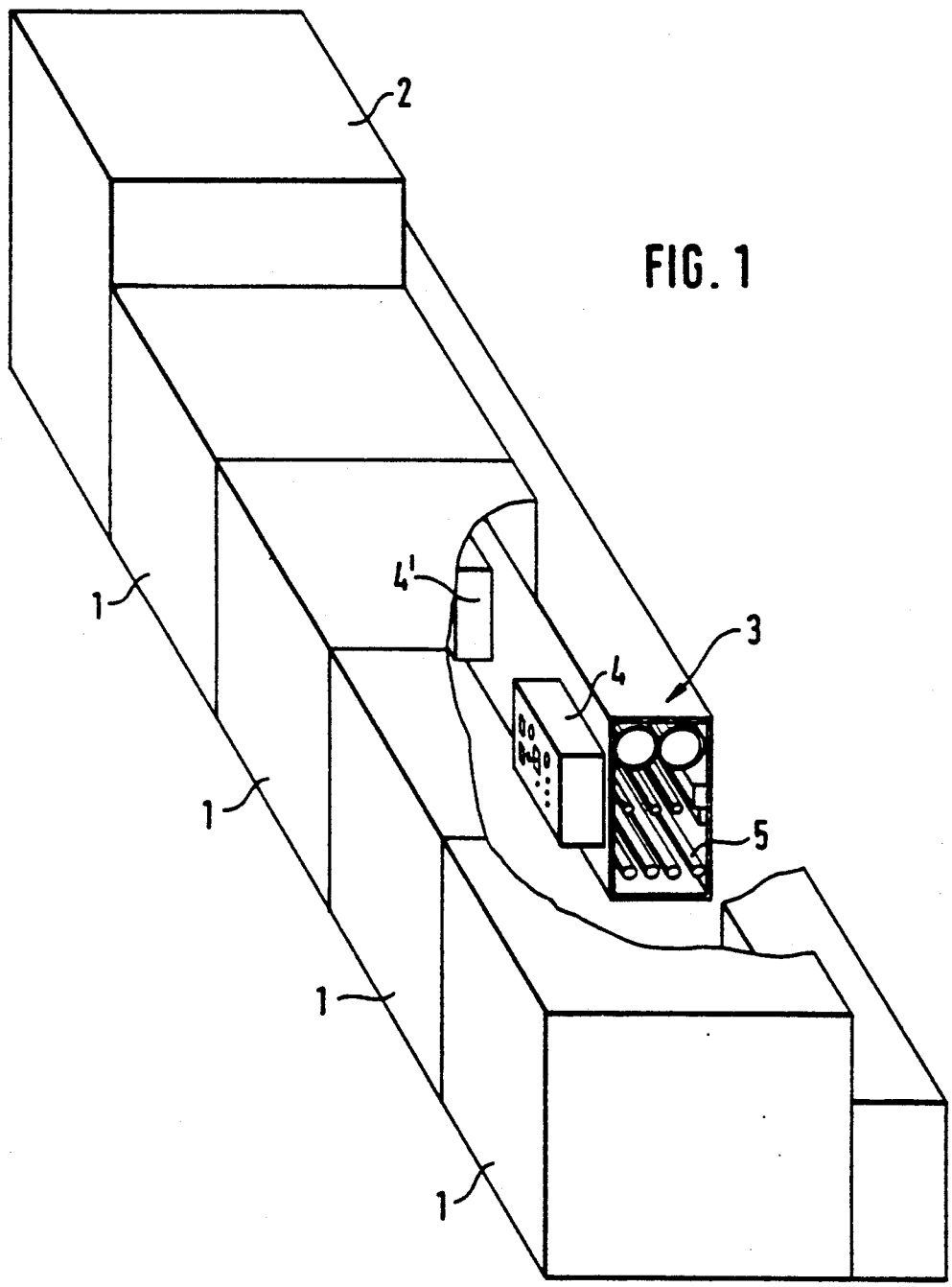
FIG. 1 is a perspective, partly cut away view illustrating a manufacturing system having process modules and one media module, coupled to a media bus.

The manufacturing system schematically shown in FIG. 1 comprises process modules 1, disposed parallel to one another, a media module 2 and a media bus 3. Each module 1, 2 is connected via a respective coupling box 4 and a countercoupling 4' to the media bus 3. The coupling boxes 4 are disposed fixedly on the media bus 3 in accordance with the grid width of the process modules 1 and media modules 2.

All the necessary inflow and outflow lines 5, which communicate with couplings 6 or plugs 7 of the coupling boxes 4, are disposed in the media bus 3. Via these inflow and outflow lines 5 not only all the necessary chemicals, gases, and liquids, but also energy and data can be supplied, removed or replaced among the various process modules 1, media bus 3 and media module or modules 2. The inflow and outflow lines 5 of the media bus 3 itself may be connected to a central supply system or to further interchangeable media modules 2, to assure the inflow and outflow of all the required media. The aforementioned inflow and outflow lines 5 also include control and measurement lines for controlling and monitoring the manufacturing processes.

Figure 2:
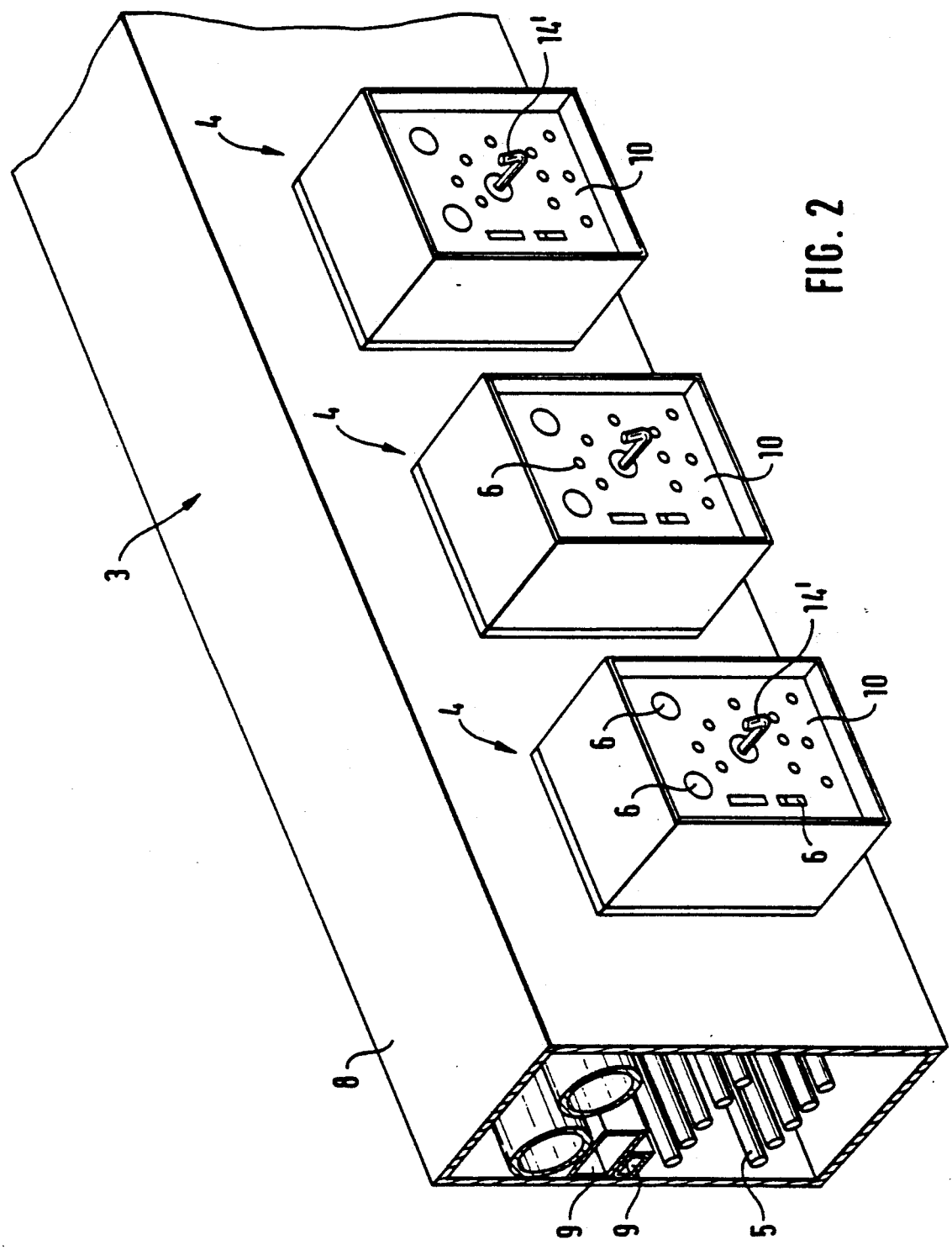
FIG. 2 is a perspective view of a media bus having coupling boxes disposed in grid spacing.
Figure 3:
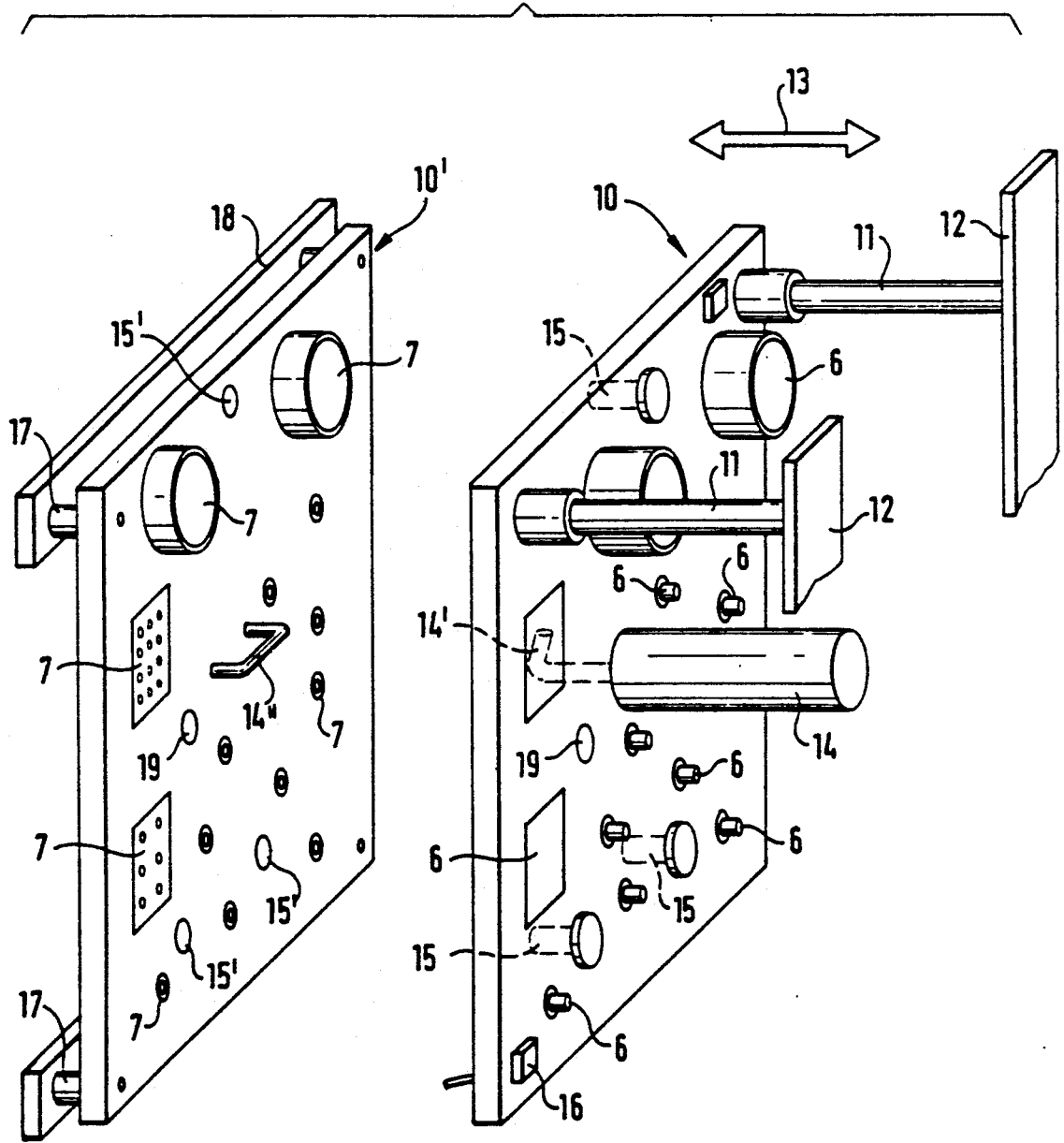
FIG. 3 illustrates bus and module coupling plates equipped with plugs and couplings.

The layout of the media bus 3, with its coupling boxes 4 disposed at grid spacing, is shown in further detail in FIG. 2. The inflow and outflow lines 5 of the media bus 3 are shielded in an elongated conduit 8, or optionally additionally carried in specially compartmented conduits 9, and communicate in a manner not shown with the various couplings 6 of the coupling boxes 4. The couplings 6 themselves, as shown in further detail in FIGS. 3, are disposed on or in a coupling plate 10. The coupling plates 10 of the various coupling boxes 4 are guided displaceably on guides rods 11 on the coupling box frame 12, vertically to the media bus 3, as indicated by the arrow 13 in FIG. 3. The displacement path is of course limited. However, the displacement path is long enough that the various couplings 6 and plugs 7, associated with one another, of the coupling plate 10 and a corresponding coupling plate 10' of the associated process module 1 or media module 2 can be joined together and disconnected.

The corresponding plugs 7 and/or couplings 6 of the inflow and outflow lines 5 of the associated process module 1 or media module 2 are disposed on the coupling plate 10', so that by joining the coupling plates 10, 10', a connection of these inflow lines 5 of the media bus 3 and the process module 1 or media module 2 can be made. To do so, the process module 1 or media module 2 is pushed to the desired point of the media bus 3 up to a stop, with the coupling plate 10 retracted on the guide rods 11. A coupling device 14, which in the exemplary embodiment is a pneumatic cylinder, is disposed approximately at the center of force of the coupling plate 10, and its piston rod has a movable hook 14', which cooperates with a mating hook 14" of the other coupling plate 10'. By means of a switch contact, the movable hook 14' is coupled to the counterpart hook 14" and the two coupling plates 10, 10' are pulled together by retracting the piston rod within the coupling device 14, and the couplings 6 and plugs 7 are thereby connected together; for the connection to be made, external forces need not be exerted upon the process module 1 or media module 2 to be connected. For precise mutual guidance in the connecting direction, guide bolts 15 are provided, distributed over the coupling plate 10, which cooperate with guide bushings 15' of the coupling plate 10'. The coupling process can be controlled and monitored by means of a contact switch 16.

To compensate for slight dimensional deviations, the coupling plate 10' is disposed somewhat movably on the frame 18 of the associated process module 1 or media module 2 via rubber mounts 17.

For later connection of additional inflow and outflow lines 5, blind openings 19 may be provided in the coupling plates 10, 10' for additional couplings 6 and/or plugs 7. Depending on the intended purpose, the plugs 7 and couplings 6 may be disposed on the coupling plates 10, 10' at transposed locations.

Figure 4:
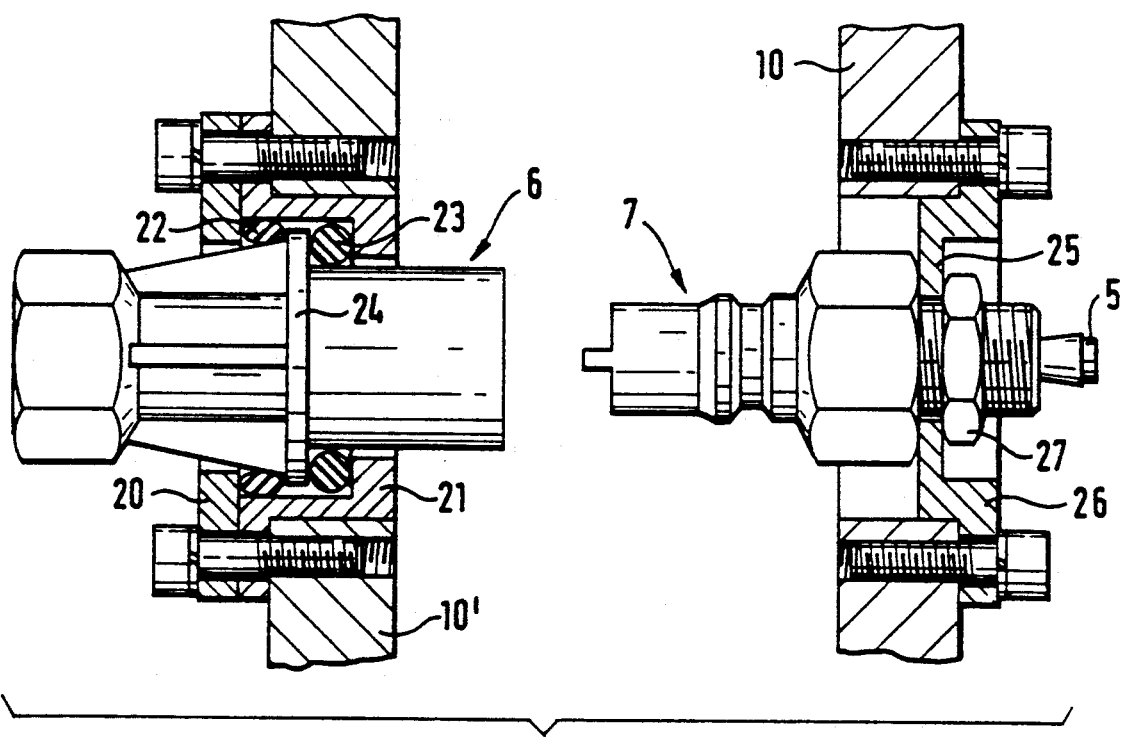
FIG. 4 illustrates a media coupling comprising a plug and coupling.

In FIG. 4, the fastening of a plug 6 and a coupling 7 to the coupling plates 10, 10' is shown on a larger scale partly in section. The coupling 6 is supported in floating fashion via retaining bushings 20, 21 between toroidal sealing rings in the form of O-rings 22, 23, and to this end has a collar 24. The plug 7 is secured by means of a nut 27 in an easily interchangeable manner to the bottom 25 of a retaining bushing 26, penetrating the bushing. The connection of an inflow or outflow line 5 is suggested in the drawing at the plug 7.

Figure 5:
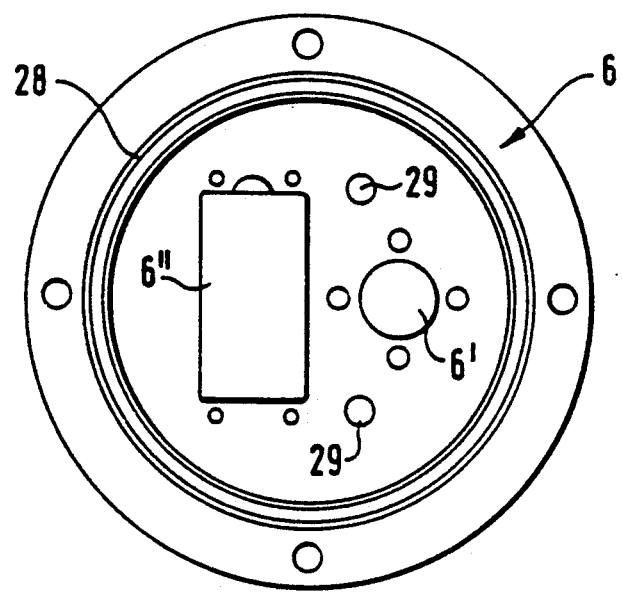
FIG. 5 is a plan view of an explosion-proof version of a coupling.

Usually the coupling and uncoupling of inflow and outflow lines 5 that carry electrical voltages should be done in the voltage-free state. If that should not be possible, then as shown in FIG. 5 for electrical and data lines, the coupling 6 shown there may be used, with data coupling 6', and an electric coupling 6', for example, or corresponding plugs, especially disposed in it. An outer jacket 28 partitions off the coupling region of the data coupling 6'' and electric coupling 6'', and a correspondingly disposed inner jacket does the same for its counterpart. The interior space thus formed may be flooded through the bores 29 with nitrogen, for instance, to render any potentially dangerous spark harmless.

What is claimed is:

1. A system for manufacturing substrates, in particular wafers, glass masks, and channels, having individual process stations for treating and/or processing the various substrates in a clean environment, comprising:
    a plurality of interchangeable and aligned process modules;
    a media bus situated parallel to the aligned process modules;
    inflow and outflow lines carried within the media bus, said inflow and outflow lines serving to supply the individual process modules with and removing therefrom the necessary chemicals, gases, liquids, data and energy;
    a plurality of coupling boxes for coupling the plurality of process modules to said media bus; and
    a countercoupling mounted to each process module, each countercoupling being coupled to a respective coupling box for thereby connecting the inflow and outflow lines to the process module of the countercoupling and being uncoupled from its respective coupling box for thereby disconnecting the inflow and outflow lines from the process module of the countercoupling.

2. The system is defined in claim 1, wherein each coupling box and each countercoupling are provided with mutually engageable couplings and/or plugs for effecting said connecting and disconnection with the inflow and outflow lines.

3. The system as defined in claim 2, wherein each coupling box and countercoupling is provided with a mutual guide which assure aligned joining of the engageable couplings and/or plugs.

4. The system as defined in claim 3, wherein those couplings and/or plugs for carrying liquid or gaseous media include a self-closing valve, so that when the corresponding coupling box and countercoupling are disconnected at least the inflow and outflow lines carrying pressurized media are closed.

5. The system as defined in claim 2, wherein each coupling box and its corresponding countercoupling are provided with a coupling plate, and wherein the couplings and/or plugs engage their respective coupling plate.

6. The system as defined in claim 5, wherein each coupling box and countercoupling is provided with a mutual guide which assure aligned joining of the engageable couplings and/or plugs, and wherein the mutual guides comprise at least two guide bolts and corresponding guide bushings situated in a spaced-apart manner on the coupling plates.

7. The system as defined in claim 6, wherein at least three guide bolts and corresponding guide bushings are provided.

8. The system as defined in claim 1, further comprising:
    a coupling device for coupling a coupling box and corresponding countercoupling.

9. The system as defined in claim 8, further comprising:
    a media module and an associated countercoupling.

10. The system as defined in claim 1, further comprising:
    contact control means for automatically effecting coupling of each coupling box and its associated countercoupling.

11. The system as defined in claim 10, wherein each process module is vertically displaceable relative to said media bus, and wherein the contact control means is actuated upon the process module reaching a terminal position.

12. The system as defined in claim 10, wherein each process module is vertically displaceable relative to said media bus, and wherein the contact control means is actuated shortly before the process module reaches a terminal position.

13. The system as defined in claim 1, wherein the connecting and disconnecting of a coupling box and corresponding countercoupling are effected without mutual displacement of the process module and media bus.

14. The system as defined in claim 1, wherein each coupling box and its corresponding countercoupling are provided with a coupling plate, and wherein the connecting and disconnecting of the coupling box and corresponding countercoupling are effected by displacement of the coupling plates of the coupling box and corresponding countercoupling.

15. The system as defined in claim 8, wherein the coupling device includes a cylinder and piston rod displaceable in the cylinder, said piston rod pulling its corresponding coupling box and countercoupling together and pushing them apart.

16. The system as defined in claim 15, wherein the coupling device is located in the center of force of the forces brought to bear in the process of coupling the coupling box and its corresponding countercoupling.

17. The system as defined in claim 8, wherein the coupling device includes a threaded bore and a motor-driven threaded rod for pulling its corresponding coupling box and countercoupling together and pushing them apart.

18. The system as defined in claim 17, wherein the coupling device is located in the center of force of the forces brought to bear in the process of coupling the coupling box and its corresponding countercoupling.

19. The system as defined in claim 2, further comprising:
a shielding jacket for surrounding the current-carrying couplings and plugs.

20. The system as defined in claim 19, wherein the shielding jacket includes an outer jacket for the plug and an inner jacket for the coupling which, during coupling, define a closed space, and wherein the length of overlap of the outer jacket and inner jacket is greater than the contact length of the plug and coupling.

21. The system as defined in claim 20, wherein the closed space is flooded with a protective gas.

22. The system as defined in claim 19, wherein the shielding jacket includes an inner jacket for the plug and an outer jacket for the coupling which, during coupling, define a closed space, and wherein the length of overlap of the outer jacket of the outer jacket and inner jacket is greater than the contact length of the plug and coupling.

23. The system as defined in claim 22, wherein the closed spaced is flooded with a protective gas.

24. The system as defined in claim 2, wherein the couplings and/or plugs are resiliently yieldingly disposed in their coupling box and countercoupling.

25. The system as defined in claim 24, wherein each coupling box and its corresponding countercoupling are provided with a coupling plate, and wherein the couplings are surrounded by an elastic sealing ring and collar, both mounted to a coupling plate.

26. The system as defined in claim 24, wherein each coupling box and its corresponding countercoupling are provided with a coupling plate, and wherein the plugs are surrounded by an elastic sealing ring and collar, both mounted to a coupling plate.

27. The system as defined in claim 2, wherein the couplings and/or plugs comprise low-contamination material.

28. The system as defined in claim 2, wherein for the cleanest media the coupling and plugs are provided at the upper region of the coupling boxes and countercoupling, and for a media that entails a greater danger of contamination the couplings and plugs are provided at the lower region of the coupling boxes and countercoupling.

* * * * *